(12) United States Patent
Asuri et al.

(10) Patent No.: US 11,489,112 B2
(45) Date of Patent: Nov. 1, 2022

(54) RESISTIVE RANDOM ACCESS MEMORY DEVICE AND METHODS OF FABRICATION

(71) Applicant: INTEL CORPORATION, Santa Clara, CA (US)

(72) Inventors: Namrata S. Asuri, Portland, OR (US); Oleg Golonzka, Beaverton, OR (US); Nathan Strutt, Beaverton, OR (US); Patrick J. Hentges, Portland, OR (US); Trinh T. Van, Hillsboro, OR (US); Hiten Kothari, Beaverton, OR (US); Ameya S. Chaudhari, Hillsboro, OR (US); Matthew J. Andrus, Hillsboro, OR (US); Timothy E. Glassman, Portland, OR (US); Dragos Seghete, Portland, OR (US); Christopher J. Wiegand, Portland, OR (US); Daniel G. Ouellette, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/641,582

(22) PCT Filed: Sep. 28, 2017

(86) PCT No.: PCT/US2017/053979
§ 371 (c)(1),
(2) Date: Feb. 24, 2020

(87) PCT Pub. No.: WO2019/066851
PCT Pub. Date: Apr. 4, 2019

(65) Prior Publication Data
US 2020/0203602 A1 Jun. 25, 2020

(51) Int. Cl.
*H01L 45/00* (2006.01)
*H01L 23/528* (2006.01)
*H01L 27/24* (2006.01)

(52) U.S. Cl.
CPC ............ *H01L 45/08* (2013.01); *H01L 23/528* (2013.01); *H01L 27/2436* (2013.01);
(Continued)

(58) Field of Classification Search
None
See application file for complete search history.

(56) References Cited

U.S. PATENT DOCUMENTS 8,872,149 B1 * 10/2014 Hsieh ...................... H01L 45/12
257/2
9,099,647 B2 * 8/2015 Liao ..................... H01L 45/1233
(Continued)

FOREIGN PATENT DOCUMENTS

| CN | 104037187 A | 9/2014 |
| CN | 106159086 A | 11/2016 |

OTHER PUBLICATIONS

Definintion of align downloaded from URL<https://www.merriam-webster.com/dictionary/align> on Dec. 26, 2021. (Year: 2021).*
(Continued)

*Primary Examiner* — J. E. Schoenholtz
(74) *Attorney, Agent, or Firm* — Finch & Maloney PLLC

(57) ABSTRACT

An apparatus, includes an interconnect, including a conductive material, above a substrate and a resistive random access memory (RRAM) device coupled to the interconnect. The RRAM device includes an electrode structure above the interconnect, where an upper portion of the electrode structure has a first width. The RRAM device further includes a switching layer on the electrode structure, where the switching layer has the first width and an oxygen exchange layer,
(Continued)

having a second width less than the first width, on a portion of the switching layer. The RRAM device further includes a top electrode above the oxygen exchange layer, where the top electrode has the second width and an encapsulation layer on a portion of the switching layer, where the switching layer extends along a sidewall of the oxygen exchange layer.

25 Claims, 9 Drawing Sheets

(52) U.S. Cl.
CPC ...... *H01L 45/1233* (2013.01); *H01L 45/1266* (2013.01); *H01L 45/146* (2013.01); *H01L 45/1675* (2013.01)

(56) References Cited

U.S. PATENT DOCUMENTS

| | | | |
|---|---|---|---|
| 9,385,316 B2* | 7/2016 | Liao | H01L 45/08 |
| 9,431,604 B2* | 8/2016 | Liao | H01L 45/1675 |
| 9,577,009 B1* | 2/2017 | Shih | G11C 13/003 |
| 10,003,022 B2* | 6/2018 | Liu | H01L 45/1675 |
| 10,038,139 B2* | 7/2018 | Chen | H01L 45/04 |
| 2008/0211011 A1 | 9/2008 | Takashima et al. | |
| 2009/0303773 A1 | 12/2009 | Rinerson et al. | |
| 2014/0166961 A1* | 6/2014 | Liao | H01L 45/146 257/4 |
| 2014/0252295 A1* | 9/2014 | Liao | H01L 27/2463 257/2 |
| 2014/0321197 A1 | 10/2014 | Ninomiya et al. | |
| 2015/0028281 A1 | 1/2015 | Chen et al. | |
| 2015/0194602 A1 | 7/2015 | Liao et al. | |
| 2015/0243708 A1 | 8/2015 | Ravasio et al. | |
| 2015/0287917 A1* | 10/2015 | Dang | H01L 45/08 257/4 |
| 2017/0004879 A1 | 1/2017 | Sekar et al. | |
| 2019/0115530 A1* | 4/2019 | Trinh | H01L 45/12 |
| 2020/0098985 A1* | 3/2020 | Trinh | H01L 45/146 |

OTHER PUBLICATIONS

International Search Report and Written Opinion for PCT/US17/53979 dated Mar. 6, 2018, 17 pgs.
International Preliminary Report on Patentability from PCT/US2017/053979 dated Apr. 9, 2020, 11 pgs.
Taiwan Office Action and Search Report received for TW Application No. 107128282, dated Apr. 1, 2022. 22 pages (including translation).

* cited by examiner

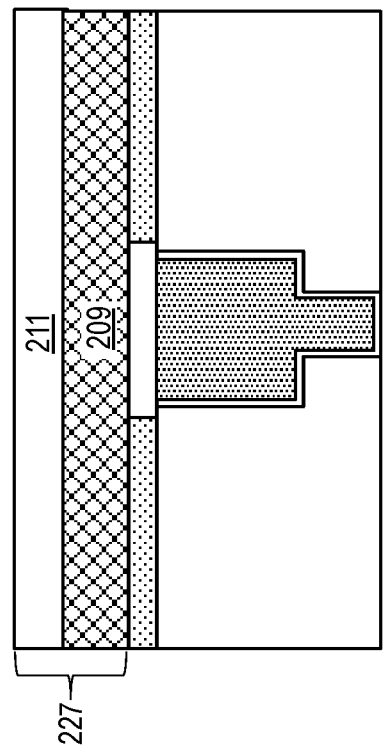
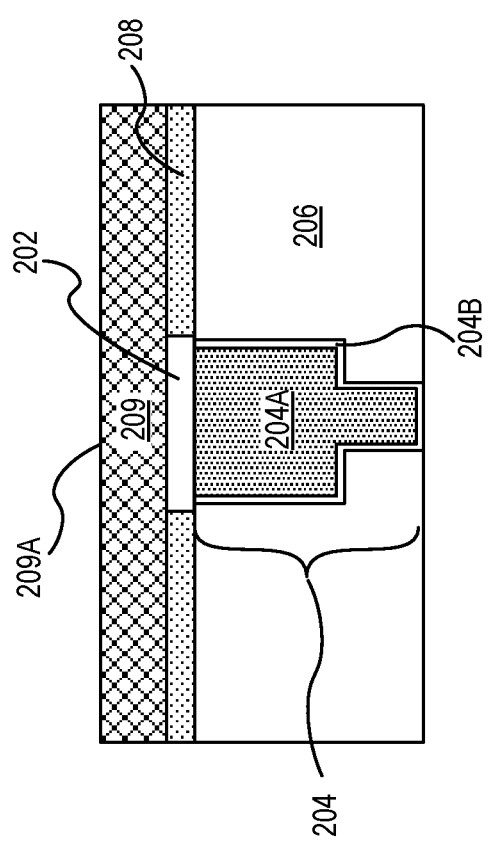
FIG. 2B
FIG. 2A

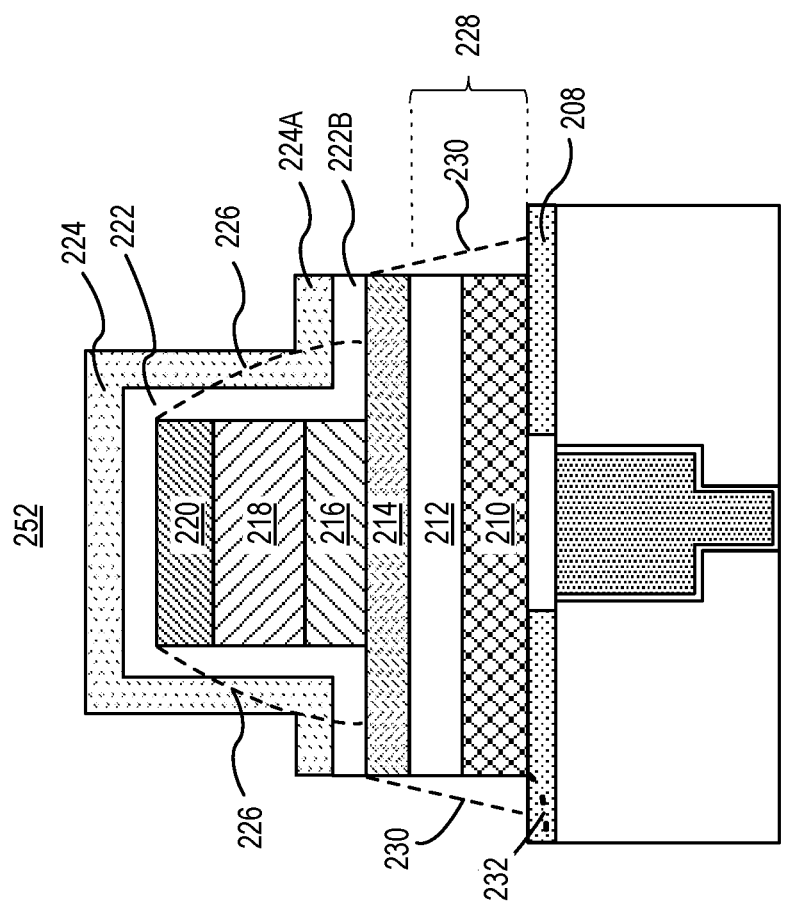
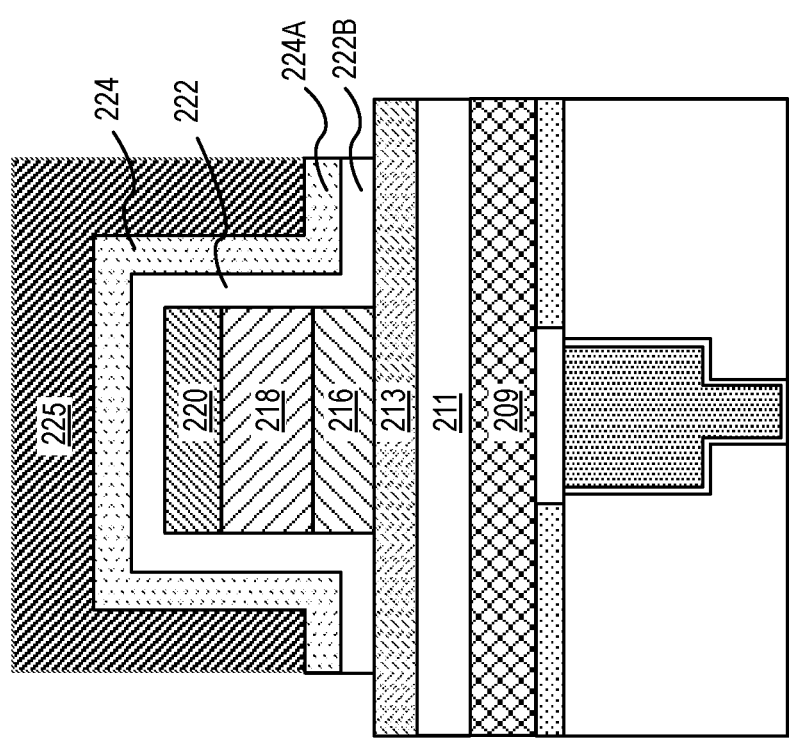
FIG. 2H
FIG. 2G

RESISTIVE RANDOM ACCESS MEMORY DEVICE AND METHODS OF FABRICATION

CLAIM OF PRIORITY

This Application is a National Stage Entry of, and claims priority to, PCT Application No. PCT/US17/53979, filed on 28 Sep. 2017 and titled "A RESISTIVE RANDOM ACCESS MEMORY DEVICE AND METHODS OF FABRICATION," which is incorporated by reference in its entirety for all purposes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile on-chip embedded memory with resistive random access memory (RRAM) devices can improve energy and computational efficiency of a system on chip (SOC). However, the technical challenges of creating an appropriate stack for fabrication of RRAM devices with high device endurance, high retention and operate at low voltages and currents present formidable roadblocks to commercialization of this technology. Specifically, the objective of memory technology to control tail bit data in a large array of memory bits necessitates tighter control of the variations in switching layer break down and switching events in individual bits. In filamentary RRAM systems, engineering a switching layer that results in lower break down voltages and in high device endurance is highly advantageous. As such, significant improvements are still needed in switching layer stacks, which rely on material advancements, fabrication techniques, or a combination of both. This area of process development is an integral part of the non-volatile memory roadmap.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIGS. 2A-2H illustrate cross sectional views representing various operations in a method of fabricating a resistive random access memory device integrated on an interconnect structure, in accordance with an embodiment of the present disclosure.

FIG. 2A illustrates a first conductive layer on a via formed above an interconnect metallization.

FIG. 2B illustrates the structure of FIG. 2A following the formation of a second conductive layer on the first conductive layer.

FIG. 2C illustrates the structure of FIG. 2B following the formation of a material layer stack for an RRAM device and following the formation of a hardmask layer on the material layer stack.

FIG. 2D illustrates the structure of FIG. 2C following an etch process used to transfer a resist pattern into the dielectric hardmask layer to form a hardmask.

FIG. 2E illustrates the structure of FIG. 2D following an etch process to pattern the top electrode layer and the oxygen exchange layer, in an accordance with an embodiment of the present disclosure.

FIG. 2F illustrates the structure of FIG. 2E following the formation of an encapsulation layer on the hardmask, on sidewalls of the top electrode and on sidewalls of the patterned oxygen exchange layer, and the formation of a second encapsulation layer on the encapsulation layer, in an accordance with an embodiment of the present disclosure.

FIG. 2G illustrates the structure of FIG. 2F following an etch process used to transfer a resist pattern into the encapsulation layer and into the second encapsulation layer, in an accordance with an embodiment of the present disclosure.

FIG. 2H illustrates the structure of FIG. 2G following an etch process to pattern a switching layer and the second and first conductive layers.

DESCRIPTION OF EXEMPLARY EMBODIMENTS

Figure 1:
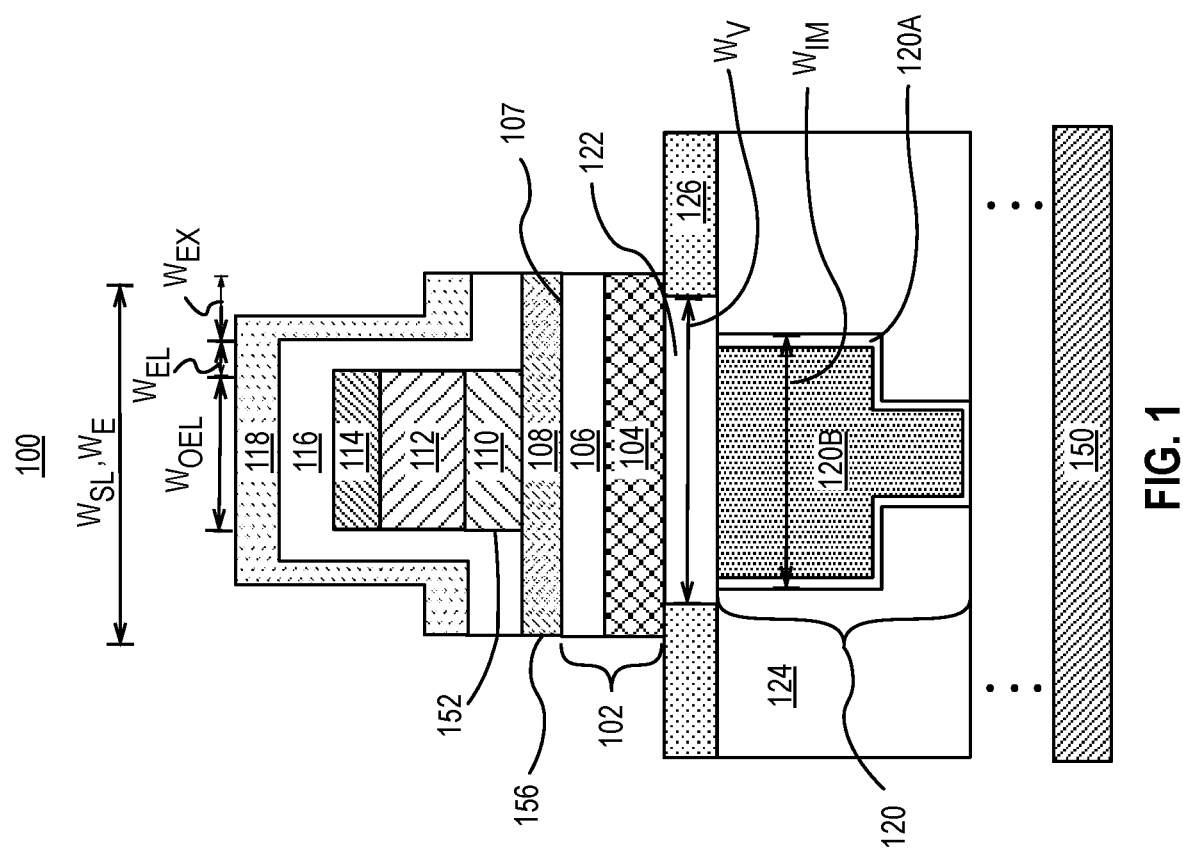
FIG. 1 illustrates a cross-sectional view of a resistive random access memory device including switching layer having a width that is larger than a width of the oxygen exchange layer, in an accordance with an embodiment of the present disclosure.

A resistive random access memory (RRAM) device having a structure optimized for localizing filaments and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. One material "above" a second material is higher within a stack of materials, but footprints of the materials need not overlap. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, one material "over" a second material has a footprint that overlaps at least a portion of the second material's footprint. In the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Non-volatile memory devices such as a magnetic tunnel junction (MTJ) memory device or a resistive random-access memory (RRAM) device depend on a phenomenon of resistance switching to store information. The non-volatile memory device functions as a variable resistor where the resistance of the device may switch between a high resistance state and a low resistance state.

Integration of a memory array with low voltage logic circuitry, such as logic circuitry operational at a voltage less than or equal to 1 Volt, may be advantageous since it enables higher operation speeds compared to having physically separate logic and memory chips. Additionally, approaches to integrating an RRAM device with a transistor to create embedded memory presents material challenges that have become far more formidable with scaling. As transistor operating voltages are scaled down in an effort to become more energy efficient, RRAM memory devices that are connected in series with such transistors are also required to function at lower voltages and currents.

Non-volatile memory devices such as a resistive random-access memory (RRAM) devices depend on a phenomenon of resistance switching to store information. The non-volatile memory device functions as a variable resistor where the resistance of the device may switch between a high resistance state and a low resistance state. Resistance switching relies on a change in conductivity of the RRAM device. In particular, a switching layer determines the conductivity. In one embodiment, the conductivity is modulated by formation and dissolution of a conductive filament in the switching layer. In one or more embodiments, the switching layer includes an oxygen containing material and the conductive filament may be formed by an action of oxygen vacancy migration in response to electric field inside the RRAM device. In order to increase the concentration of oxygen vacancies to promote switching at lower voltages, an additional layer known as an oxygen exchange layer may be disposed between the switching layer and one of the electrodes. While conductive filamentary switching may be enhanced by an oxygen exchange layer, the variability in the voltages required to switch the device between a high resistance state and a low resistance state may be influenced by the size and location of the conductive filament. Filaments formed near or at the edge of an RRAM device, in particularly away from the center, can lead to a high level of variability in device performance. Such operational variability manifests in write voltage and write current variability leading to erroneous programming states of a device. In accordance with an embodiment of the present invention, a switching layer has a lateral dimension that is larger than a lateral dimension of an oxygen exchange layer to localize the filament away from the edges of the RRAM device. By localizing the filament away from the edges, issues associated with operational variability may be avoided. FIG. 1 illustrates a cross-sectional view of an RRAM device 100 disposed above an interconnect structure 120, in an accordance with an embodiment of the present disclosure. The RRAM device 100 includes an electrode structure 102 having a first width ($W_E$), a switching layer 108, having the first width, disposed on the electrode structure 102. The RRAM device 100 further includes an oxygen exchange layer 110, having a second width ($W_{OEL}$), disposed on the switching layer 108, where the second width is less than first width, a top electrode 112 disposed on the oxygen exchange layer 110 and a hardmask 114 disposed on the top electrode 112. In the illustrative embodiment, an encapsulation layer 116 is disposed on a portion of the switching layer 108 and extends along a sidewall, 152 of the oxygen exchange layer to an uppermost portion of the hardmask 114 and covers an uppermost surface of the hardmask 114. In an embodiment, the encapsulation layer 116 further includes a lateral portion, having a length $W_{EX}$, that extends from the sidewall of the oxygen exchange layer 110 to a sidewall 156 of the switching layer 108. The encapsulation layer 116 includes outermost sidewalls separated by a distance equal to or less than the first width ($W_E$). The encapsulation layer 116 has a thickness, $W_{EL}$, along the sidewall of the oxygen exchange layer 110. Depending on embodiments, the thickness, $W_{EL}$, is between 3 nm-15 nm. In one example, as is depicted in FIG. 1, $W_{EX}$, is greater than $W_{EL}$. In another example, $W_{EX}$ is less than $W_{EL}$. The combined thickness, $W_{EL}$, and the length, $W_{EX}$, determines the width, $W_{SL}$, of the switching layer 108 and consequently the separation between sidewall 156 and the sidewall 152 of the oxygen exchange layer 110. In an embodiment, the width, $W_{SL}$, of the switching layer 108 is at least 20 nm larger than the width, $W_{OEL}$, of the oxygen exchange layer 110. As discussed above, when the sidewall 156 of the switching layer 108 is distal from the sidewall 152 of the oxygen exchange layer 110, filaments that may form in the RRAM device 100 may be localized away from the sidewall 156.

In an embodiment, a second encapsulation layer 118 is disposed directly on the encapsulation layer 116. The second encapsulation layer 118 is absent from the sidewall 156 of the switching layer 108. The second encapsulation layer 118 includes outermost sidewalls separated by a distance equal to or less than the first width ($W_E$). Depending on the length, $W_{EX}$ of the lateral portion of the encapsulation layer 116, the second encapsulation layer 118 may have a thickness that is between 5 nm and 15 nm. The second encapsulation layer 118 is designed to preserve the encapsulation layer 116 disposed on the sidewall 152 of the oxygen exchange layer 110. In an embodiment, the electrode structure 102 includes a first conductive electrode 104 and a second conductive electrode 106 disposed on the first conductive electrode 104 as is depicted in the cross-sectional illustration of FIG. 1. In some embodiments, the first conductive electrode 104 includes a layer of metal such as W, Ti, Ta or Ru. In other embodiments, the first conductive electrode 104 includes an alloy such as WN, TiN, or TaN. In an embodiment, the first conductive electrode 104 includes a layer of TiN that has a substantially smooth uppermost surface, such as surface roughness of the order of 1 nm-2 nm. In an embodiment, the first conductive electrode 104 has an electrical resistivity between 280-310 µ106-cm. Depending on embodiments, the first conductive electrode 104 has a thickness between 1.5-25 nm. In an embodiment, the second conductive electrode 106 includes a noble metal such as Pt, Pd or Ru. Depending on embodiments, the second conductive electrode 106 has a thickness between 2 nm-10 nm. First conductive electrode 104 may have outermost sidewalls that are aligned with outermost sidewalls of second conductive electrode 106. While the illustrative embodiment depicts the electrode structure 102 to have outermost sidewalls that are substantially vertical, other embodiments include sidewalls that are tapered to various degrees depending on the choice of materials and thicknesses for the first conductive electrode 104 and the second conductive electrode 106. Sidewalls of encapsulation layer 116, second encapsulation layer 118, and electrode structure 102 may be aligned to form at least part of an overall sidewall.

In an embodiment, an intermediate layer (not illustrated) is disposed between the first conductive electrode 104 and the second conductive electrode 106, wherein the intermediate layer comprises oxygen. In an embodiment, the intermediate layer has a non-uniform oxygen composition. In an embodiment, the intermediate layer has a thickness that is non-uniform. In one embodiment, the intermediate layer has portions that are discontinuous in a cross-sectional plane.

In an embodiment, the switching layer 108 includes oxygen and a metal (M), such as, but not limited to, hafnium, tantalum, zirconium, tungsten or titanium. Example compositions of the switching layer 108 include hafnium oxide, tantalum oxide, zirconium oxide, titanium oxide and tungsten oxide. Depending on embodiments, the switching layer 108 may be stoichiometric or non-stoichiometric in oxygen content. For embodiments with hafnium, with an oxidation state +4, the switching layer 108 has a chemical composition of $MO_X$, where O is oxygen and X is, or is substantially close to, 2, such as between 1.9-2.0. For tantalum embodiments with an oxidation state +5, the switching layer 108 has a chemical composition of $M_2O_X$, where O is oxygen and X is or is substantially close to 5, such as between 4.90-5.0. For any of these compositions, the thickness of the switching layer 108 may vary. In one embodiment, the switching layer 108 has a thickness of at least 2 nm. In another embodiment, switching layer 108 has a thickness between 2 nm-5 nm. Depending on embodiments, the sidewall 156, of the switching layer 108 may be topographically smooth or jagged. Jagged sidewalls may lead to non-repeatable filament formation and present issues for device functionality.

In an embodiment, the oxygen exchange layer 110 acts as a source of oxygen vacancies or as a sink for oxygen atoms as well as a barrier layer against oxygen out diffusion from the second switching layer 108. In filamentary RRAM systems, variation in switching voltage for a single RRAM device may be modulated by fine tuning oxygen vacancy concentration, which is widely understood to drive filament formation and dissolution in metal oxide films. In an embodiment, the oxygen exchange layer 110 includes a metal such as but not limited to, tungsten, hafnium, tantalum or titanium. In an embodiment, the oxygen exchange layer 110 and the switching layer 108 includes a same metal. In an embodiment, oxygen exchange layer 110 has a thickness between 5 nm and 20 nm. In an embodiment, the thickness of the oxygen exchange layer 110 is at least one and half times the thickness of the switching layer 108.

In an embodiment, the top electrode 112 has a thickness between 30-70 nm. In an embodiment, the top electrode 112 includes a same metal such as, but not limited to Ta, TaN or TiN.

In an embodiment, a portion of an interface 107 between the second conductive electrode 106 and the switching layer 108 is oxidized. In one such embodiment, the second conductive electrode 106 includes tungsten or ruthenium and an oxidized uppermost portion of the second conductive electrode 106 remains conductive.

The encapsulation layer 116 may be any suitable dielectric material such as but not limited to carbon doped silicon nitride or silicon nitride. In an embodiment, the dielectric material of the encapsulation layer 116 is a non-oxygen-containing material utilized to prevent oxidation of the oxygen exchange layer 110. The second encapsulation layer 118 may be any suitable dielectric material such as but not limited to carbon doped silicon nitride, silicon oxide, carbon doped oxide or silicon nitride.

The illustrative embodiment of FIG. 1, further depicts a via 122 directly below the RRAM device 100, where the via 122 is coupled with an interconnect metallization 120 disposed in a dielectric layer 124 above the substrate 150. Such an interconnect metallization 120 may include lateral runs (e.g., metallized trenches within dielectric) and vertical runs (e.g., metallized vias). In an embodiment, the via 122 is surrounded by a passivation layer 126. In an embodiment, the passivation layer 126 is disposed on a portion of the interconnect metallization 120 and on the dielectric layer 124.

Referring again to FIG. 1, via 122 includes a material such as but not limited to W, TiN, TaN, Ru or Ta. In an embodiment, the via 122 has a thickness between 10 nm-20 nm. As shown, the via 122 has a width, $W_V$. In an embodiment, $W_V$, of the via 122 is less than the width, $W_E$, of the electrode structure 102. In an embodiment, $W_V$, of the via 122 is more than the width, $W_E$, of the electrode structure 102. In an embodiment, $W_V$, is between 20 nm-50 nm. In an embodiment, $W_{IM}$, is between 20 nm-50 nm. In an embodiment, $W_E$, is between 40 nm-50 nm.

In an embodiment, the passivation layer 126 includes a material such as but not limited to silicon nitride, silicon carbide or carbon-doped silicon nitride. In an embodiment, the via 122 and the passivation layer 126 have uppermost surfaces that are co-planar or substantially co-planar.

Referring again to FIG. 1, in an embodiment, the interconnect metallization 120 has an uppermost surface that is coplanar or substantially co-planar with an uppermost surface of the dielectric layer 124. In an embodiment, the interconnect metallization 120 includes a barrier layer 120A, and a fill metal 120B disposed on the barrier layer 120A. In an embodiment, the barrier layer 120A includes a material such as but not limited to tantalum nitride, tantalum or ruthenium. In an embodiment, the fill metal 120B includes a metal such as W or Cu. In an embodiment, the interconnect metallization 120 has a width, $W_{IM}$. In an embodiment, the interconnect metallization 120 has a width, $W_{IM}$ that is greater than the width, $W_V$, of the via 122. In an embodiment, the interconnect metallization 120 has a width, $W_{IM}$ that is greater than the width, $W_E$, of the electrode structure 102. In an embodiment, the interconnect metallization 120 has a width, $W_{IM}$ that is substantially similar to the width, $W_E$, of the electrode structure 102. In an embodiment, the interconnect metallization 120 has a width, $W_{IM}$ that is less than the width, $W_E$, of the electrode structure 10.

In an embodiment, the dielectric layer 124 may include oxygen and silicon, with examples including silicon dioxide ($SiO_2$), carbon doped oxide (CDO), and silicon nitride. Dielectric layer 124 may also include organic polymers such as perfluorocyclobutane or polytetrafluoroethylene, fluorosilicate glass (FSG), and organosilicates such as silsesquioxane, siloxane, or organosilicate glass. In an embodiment, the total thickness of dielectric layer 124 is between 30 nm-100 nm.

In an embodiment, the substrate 150 includes a suitable semiconductor material such as but not limited to, single crystal silicon, polycrystalline silicon and silicon on insulator (SOI). In another embodiment, substrates 150 includes other semiconductor materials such as germanium, silicon germanium or a suitable group III-V compound. Logic devices such as MOSFET transistors and access transistors and may be formed on the substrate 150. Logic devices such as access transistors may be integrated with memory devices such as the RRAM device 100 to form embedded memory. Embedded memory including RRAM devices and logic MOSFET transistors can be combined to form functional integrated circuits such as a system on chip (SOC) and microprocessors.

FIGS. 2A-2H illustrate cross sectional views representing various operations in a method of fabricating an RRAM device integrated on an interconnect structure, in accordance with an embodiment of the present disclosure.

FIG. 2A illustrates a first conductive layer on a via formed above an interconnect metallization, in accordance with an embodiment of the present disclosure. The metallization structure 204 may formed by a damascene or a dual damascene process that is well known in the art. In an embodiment, the metallization structure 204 is the same as or substantially the same as the metallization structure 120 described in association with FIG. 1. In an embodiment, the metallization structure 204 includes a barrier layer 204A, and a fill material 204B disposed on the barrier layer 204A. In an embodiment, the dielectric layer 206 is the same as or substantially the same as the dielectric layer 124 described in association with FIG. 1.

In an embodiment, the via 202 is formed by blanket depositing a layer of a metal or a metal alloy on the metallization structure 204, and patterning the layer of the metal or metal alloy. In an embodiment, the patterning process includes plasma etching the metal or a metal alloy to form the via 202 over a portion of the metallization structure 204. In an embodiment, the via 202 includes a material that is the same as or substantially the same as the material of the via 122 described in association with FIG. 1.

In an embodiment, a passivation layer 208 is formed by blanket depositing a layer of an insulating material on the via 202 and on the dielectric layer 206 and then planarizing the insulating material to expose the via 202.

In an embodiment, the planarization process results in the via 202 having an uppermost surface that is coplanar or substantially coplanar with an uppermost surface of the passivation layer 208. In an embodiment, the planarization process includes a polish process. In an embodiment, the passivation layer 208 includes a material that is the same as or substantially the same as the materials of the passivation layer 126 described in association with FIG. 2.

In an embodiment, the first conductive layer 209 is deposited on the uppermost surface of the via and on the uppermost surface of the passivation layer 208. In an embodiment, the first conductive layer 209 is blanket deposited by a physical vapor deposition (PVD), a chemical vapor deposition (CVD), a plasma enhanced chemical vapor deposition (PECVD) or an atomic layer deposition process (ALD). In an embodiment, the first conductive layer 209 includes a metal such as but not limited to W, Ru, Ti or Ta or an alloy such as but not limited to WN, TiN or TaN. In an embodiment, the first conductive layer 209 includes a layer of TiN, deposited by a PVD process. In one embodiment, a layer of TiN deposited by a PVD process results in a layer having low resistivity. In an embodiment, the layer of TiN is deposited by a PVD process has an electrical resistivity between 100-150 μ-Ω-cm.

In an embodiment, the first conductive layer 209 is deposited to a thickness of 35 nm and has an uppermost surface 209A that can have a surface roughness of at least 5 nm. In one example, a first conductive layer 209 having a surface roughness of at least 5 nm can be planarized to reduce surface roughness. The first conductive layer 209 may be planarized, for example, by a chemical mechanical polish (CMP) process. In an embodiment, the CMP process removes 10 nm-30 nm of first conductive layer 209. In an embodiment, the CMP process topographically planarizes the uppermost surface of the first conductive layer 302 resulting in a surface roughness of less than 1 nm. Reducing surface roughness of the first conductive layer 209 may offer advantages during cycling of an RRAM device as it may serve to reduce abrupt filament nucleation and hence lessen variation in cycling voltage in a large array of RRAM devices.

FIG. 2B illustrates the structure of FIG. 2A following the formation of a second conductive layer 211 on the first conductive layer 209 to form a bottom electrode layer 227. In an embodiment, the second conductive layer 211 includes a noble metal such as Pt, Pd or Ru. In an embodiment, the second conductive layer 211 is blanket deposited by a physical vapor deposition (PVD), a chemical vapor deposition (CVD), a plasma enhanced chemical vapor deposition (PECVD) or an atomic layer deposition process (ALD). The second conductive layer 211 may be deposited to a thickness between 2 nm-10 nm. Noble metals such as Pt, Pd and Ru present numerous challenges for plasma etching. Thus, in numerous embodiments, the second conductive layer 211 is deposited to a thickness to sufficiently provide an inert electrode, but still be able to be patterned in a subsequent etch operation. An inert electrode is desirable to minimize effects of external sources of oxygen that may potentially impact vacancy migration during RRAM device operation.

Figure 2D:
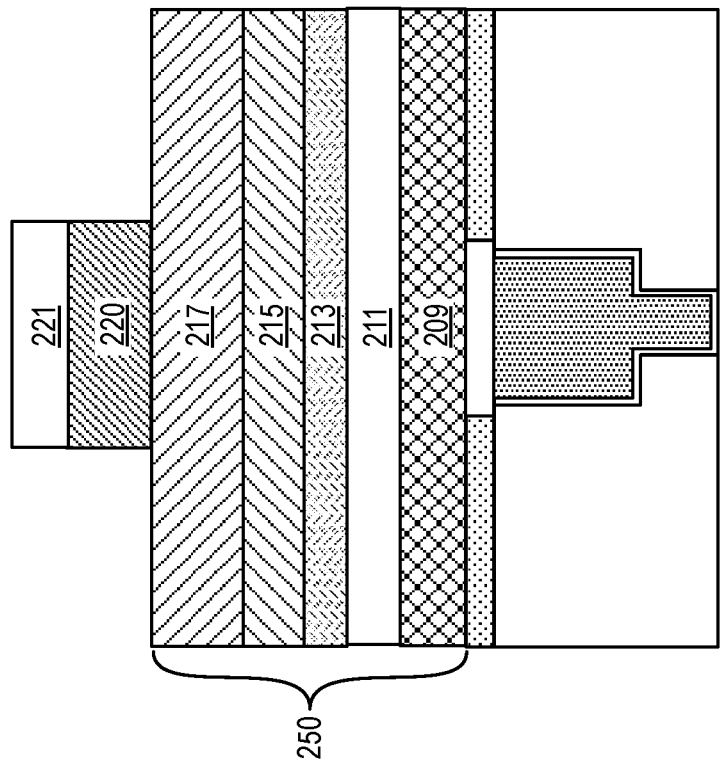
Figure 2C:
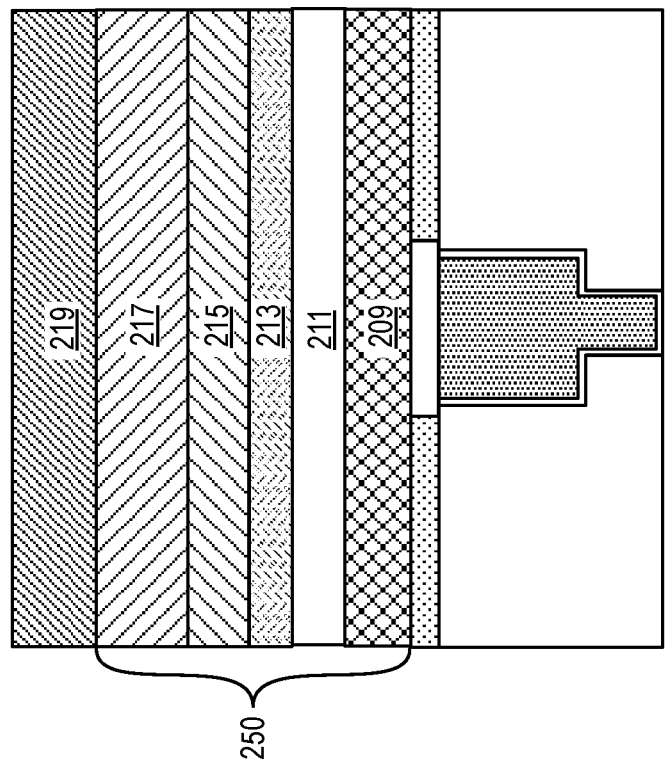

FIG. 2C illustrates the structure of FIG. 2B following the completion of deposition of a material layer stack 250 for an RRAM device and following the formation of a dielectric hardmask layer 219 on the material layer stack 250. In one embodiment, a switching layer 213 is blanket deposited on the second conductive layer 211. In an embodiment, the switching layer 213 is a material that includes oxygen and a metal such as, but limited to, $HfO_2$, $Ta_2O_5$, $TiO_2$ and $ZrO_2$. In an embodiment, the switching layer 213 is a stoichiometric oxide of the metal such as Hf, Ta, Ti and Zr. In an embodiment, a switching layer 213 that is stoichiometric is formed using an atomic layer deposition (ALD) process. The ALD process may be characterized by a slow and a controlled deposition rate resulting in a metal oxide film with a stoichiometric oxygen content. In an embodiment, the switching layer 213 is deposited using a physical vapor deposition (PVD) process. The PVD process may include depositing a metal oxide film in an ambient containing oxygen flowing at a constant or at a variable rate. Such a deposition process may form a switching layer 213 that is slightly deficient in oxygen concentration resulting in a film that is non-stoichiometric in oxygen content. The switching layer 213 is deposited to a thickness between 2 nm-5 nm.

The oxygen exchange layer may include a material having a composition and a thickness such as is described above in association with the oxygen exchange layer 110. In an embodiment, the oxygen exchange layer 215 is blanket deposited on the switching layer 213, for example using a PVD process. In one such embodiment, the oxygen exchange layer 215 is deposited sequentially after depositing the switching layer 213, in a same chamber or in a same tool without breaking vacuum.

Referring again to FIG. 2C, a top electrode layer 217 is deposited on the oxygen exchange layer 215. In an embodiment, the top electrode layer 217 includes a material that is the same as or substantially the same as the material of the top electrode 112 (FIG. 1). The top electrode layer 217 may be deposited using a PVD process. In one example the top electrode layer 217 and the oxygen exchange layer 215 are deposited sequentially in a same chamber or in a same tool without breaking vacuum. Sequential deposition without an air-break may prevent an uppermost portion of the oxygen exchange layer 215 from becoming oxidized. Oxidation of the oxygen exchange layer can introduce variability in switching voltages during RRAM device operation.

A hardmask layer 219 is deposited over top electrode layer 217 and may include any material sufficient to act as an insulator layer and mask during a subsequent etching of the RRAM material layer stack 250. In the illustrative embodiment, the hardmask layer 219 includes a metal such as Ta, or TaN that is sufficient to act as a mask during a subsequent etching of the RRAM material layer stack 250. Upon deposition of the hardmask layer 219, the RRAM material layer stack 250, maybe subjected to a high temperature anneal process. In an embodiment, anneal temperatures reach 400° C. and last for a time period of 60 minutes. Annealing is a thermal phenomenon that may drive the oxygen from the switching layer 213, thus creating oxygen vacancies, $V_o$, in the switching layer 213. The oxygen from the switching layer 213 may diffuse toward the oxygen exchange layer 215 above. The anneal may increase the $V_o$ density in a stoichiometric switching layer priming it for a conductive filament creation.

FIG. 2D illustrates the structure of FIG. 2C following an etch process used to transfer a pattern from a resist mask 221 into the hardmask layer 219 to form a hardmask 220. In an embodiment, an anisotropic plasma etch process is used to pattern the hardmask layer 219 with selectivity to the resist mask 221. It is to be appreciated that polymeric films, which may result from the interaction between a photoresist material and etch byproducts during memory device etch, may adhere to the sidewall portions of an etched RRAM material stack. If portions of such polymeric layers have metallic components, device performance may be significantly degraded. In one embodiment, the resist mask 221 is removed after the hardmask 220 is patterned but prior to etching RRAM material layer stack 250. In an embodiment, the resist mask 221 is removed using an ash process.

Figure 2F:
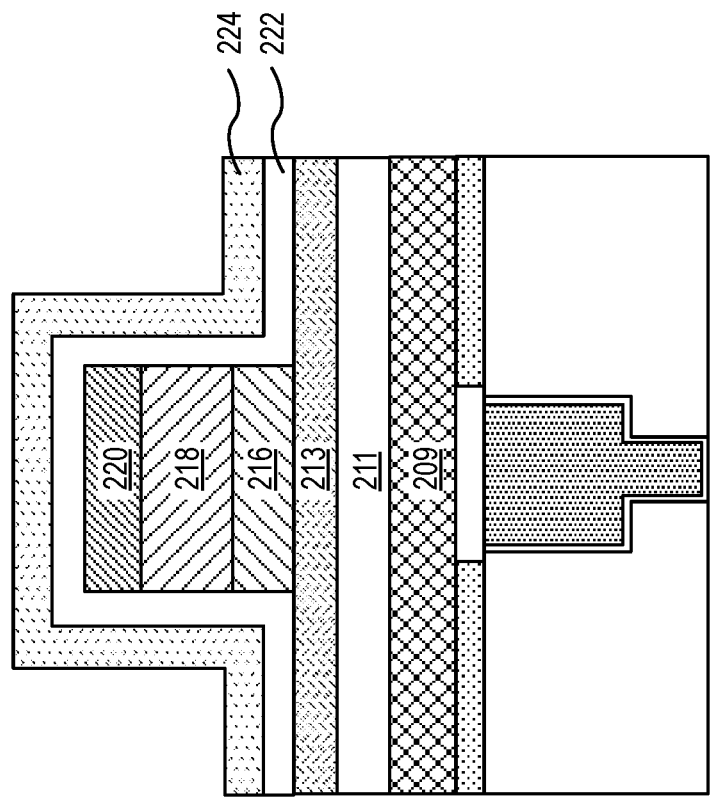
Figure 2E:
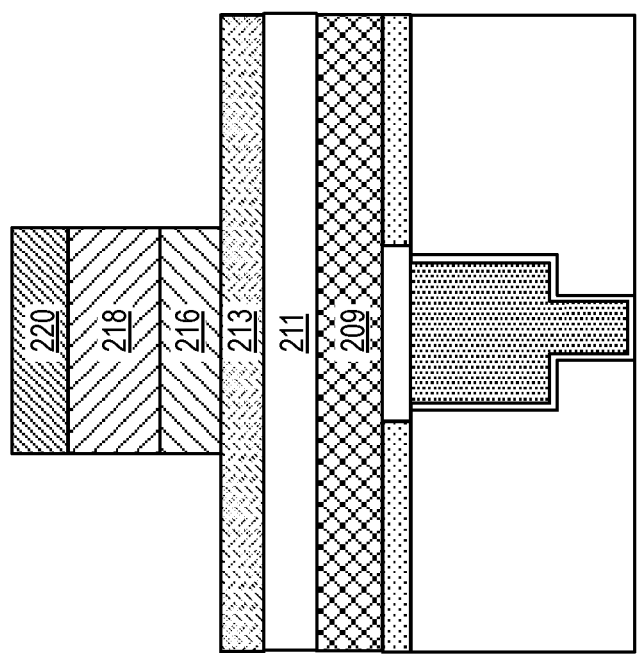

FIG. 2E illustrates the structure of FIG. 2D following an etch process to pattern the top electrode layer 217 and the oxygen exchange layer 215, in an accordance with an embodiment of the present disclosure. In an embodiment, etch process is continued to transfer the hardmask 220 to pattern the top electrode 217 layer and the oxygen exchange layer 215 to form a top electrode 218 and an oxygen exchange layer 216. In the illustrative embodiment, the etch process is halted after an uppermost surface of the switching layer 213 is uniformly exposed. Referring again to FIG. 2E, the uppermost surface of the hardmask 220 is substantially flat after the etch process. In other embodiments, the hardmask 220 has a curved profile. In the illustrative embodiment, as a result of an aggressive etch process to pattern the top electrode layer 217 and the oxygen exchange layer 215, the hardmask 220 has a thickness that has been reduced compared to a thickness of the as deposited hardmask layer 219.

FIG. 2F illustrates the structure of FIG. 2E following the formation of an encapsulation layer 222 on the hardmask 220, on sidewalls of the top electrode 218 and on sidewalls of the oxygen exchange layer 216. FIG. 2F illustrates also illustrates the formation of a second encapsulation layer 224 on the encapsulation layer 222, in an accordance with an embodiment of the present disclosure. In an embodiment, an encapsulation layer 222 is deposited immediately following the plasma etch process with an airbreak. In an embodiment, the encapsulation layer 222 is deposited in a process toolset that is different from the etch toolset. Examples of materials for encapsulation layer 222 include silicon nitride, silicon carbide, carbon-doped silicon nitride, or any suitable non-oxygen containing material. In an embodiment, the encapsulation layer 222 has a thickness approximately in the range of 5 nm-20 nm. The second encapsulation layer 224 includes a material that is the same or substantially the same as the second encapsulation layer 118. The material of the second encapsulation layer 224 is chosen to provide selectivity against etching the switching layer 213, the second conductive layer 211 and the first conductive layer 209. By preserving the second encapsulation layer 224, the sidewall of the oxygen exchange layer 216 may remain protected from external contaminants such as aggressive etchants that will be utilized to etch switching layer 213 and the second conductive layer 213.

FIG. 2G illustrates the structure of FIG. 2F following an etch process used to transfer the mask of a resist pattern 225 into the encapsulation layer 222 and into the second encapsulation layer 224, in an accordance with an embodiment of the present disclosure. In an embodiment, the resist mask defines a footprint of the final RRAM device.

In one embodiment, a plasma etch process is utilized to etch the encapsulation layer 222 and the second conductive layer 224 to form a patterned encapsulation layer 222 and a patterned second encapsulation layer 224. After completion of the patterning process the resist is removed prior to continuing the etch.

In a different embodiment, the plasma etch process etches the second encapsulation layer 224 to form a patterned second encapsulation layer 224 and the resist is subsequently removed. The patterned second encapsulation layer 224 is then utilized to pattern the underlying encapsulation layer 222. For example, a silicon dioxide—patterned second encapsulation layer 224 may be utilized to pattern the encapsulation layer 222 including a silicon nitride.

FIG. 2H illustrates the structure of FIG. 2G following an etch process to pattern the switching layer 213 and the bottom electrode layer 227 to form an RRAM device, in an accordance with an embodiment of the present invention. In an embodiment, the patterned second encapsulation layer 224 is utilized as a mask during the etching process to create a patterned switching layer 214 and a bottom electrode 228. The bottom electrode 228 includes a second conductive electrode 212 and a first conductive electrode 210.

It is to be appreciated that etching of a second conductive layer 211 including a noble metal can consume a significant portion of the encapsulation layers. In one example, an uppermost portion of the patterned second encapsulation layer 224 above the dielectric hardmask 220, and majority of the lateral portion 224A of the patterned insulator layer is removed during the patterning process. An uppermost portion of the encapsulation layer 222 formed above the dielectric hardmask 220 and majority of the lateral portion 222A of the encapsulation layer 222 may also be removed during the patterning process. In an embodiment, the dashed line 226 in FIG. 2H provides an outline of the remaining patterned second encapsulation layer 224 and the patterned encapsulation layer 222 after the RRAM device is patterned.

In one embodiment, the plasma etch process may yield a patterned switching layer 214 and bottom electrode 228 having a tapered sidewall profile. One example of a tapered sidewall profile is provided by dashed line 230. In another example, the patterned second encapsulation layer 224 and the patterned encapsulation layer 222 may have a resulting profile given by dashed line 226 and the patterned switching layer 214 and bottom electrode 228 may have a resulting profile given by dashed line 230. In a further embodiment, the etching process utilized to form the RRAM device 252 may also erode a portion of the passivation layer 208 as indicated by a dashed line 232. In yet another embodiment, some or all of the dielectric hardmask 220 may also be consumed while forming the RRAM device 252.

Referring once again to FIGS. 2F-2G, while a method to pattern the second conductive layer 211 and the first conductive layer 209 can be carried out after forming an encapsulation layer 222 on the uppermost surface of the switching layer 213, in a different embodiment, the switching layer can be patterned before depositing the encapsulation layer 222.

Figure 3B:
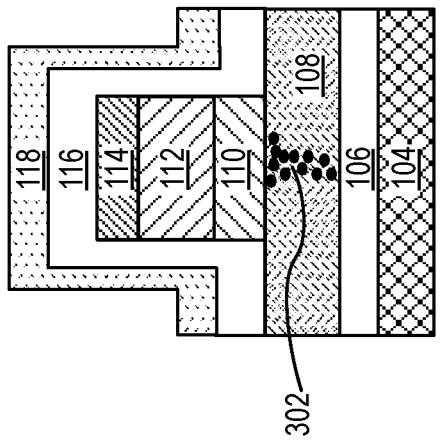
FIG. 3B illustrates a cross-sectional view of a conductive filament formed in an RRAM device, in an accordance with an embodiment of the present invention
Figure 3C:
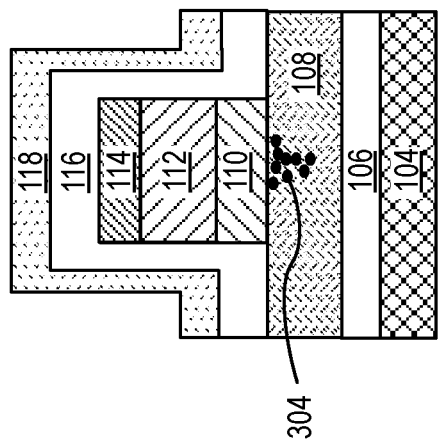
FIG. 3C illustrates a cross-sectional view of an RRAM device where the conductive filament is broken, in an accordance with an embodiment of the present invention.
Figure 3A:
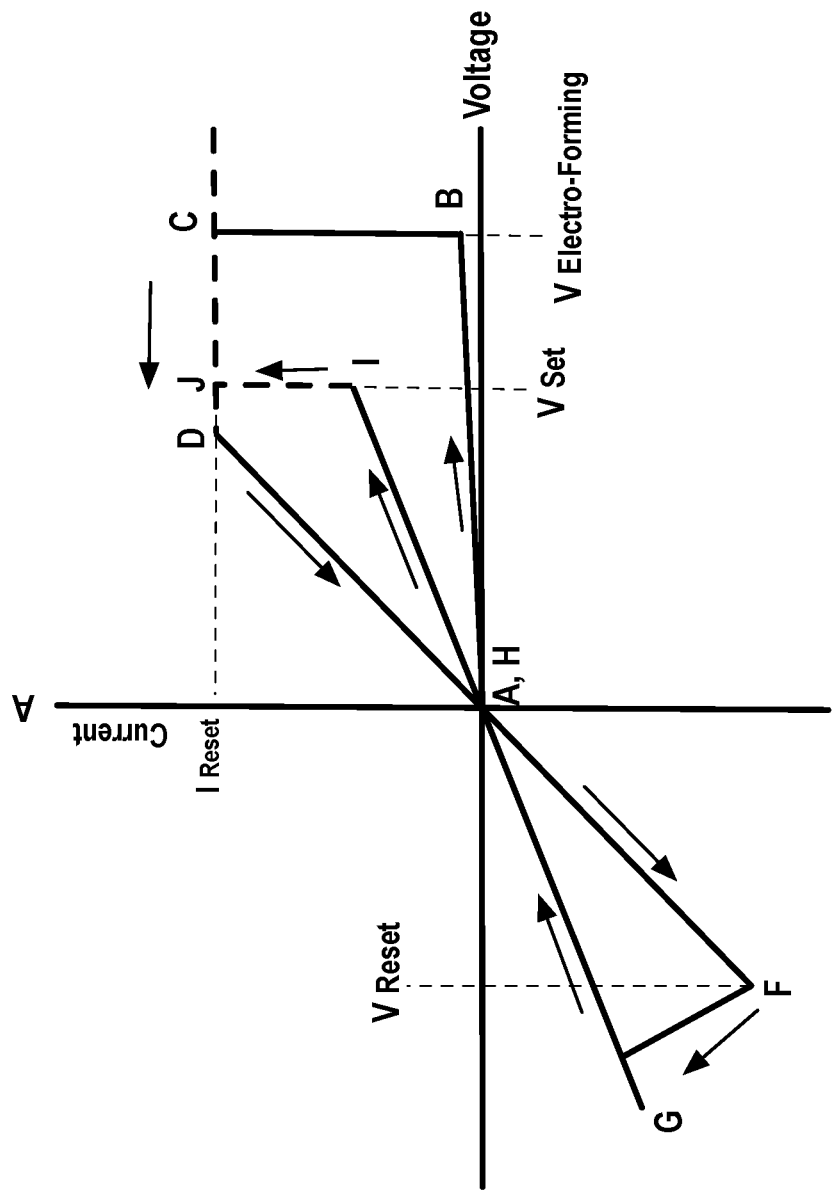
FIG. 3A illustrates an I-V plot, demonstrating concepts involved with filament formation and voltage cycling (reading and writing) in an RRAM device, in accordance with embodiments of the present invention.

FIG. 3A illustrates an I-V plot, demonstrating concepts involved with filament formation and voltage cycling (reading and writing) in an RRAM device, such as an RRAM device 300 depicted in FIG. 3B, in accordance with embodiments of the present invention. RRAM device 300 is the same or substantially the same as the RRAM device 100. The initial operation of the RRAM device 300 begins by applying a voltage, between the top electrode 112 and the first conductive electrode 104, that is increases in magnitude until it reaches a value $V_{Electro\text{-}Forming}$ (point A to B). In an embodiment, $V_{Electro\text{-}Forming}$ is less than 1.6V. In an "intentional" one-time breakdown process, known as electro-forming, oxygen vacancies, $V_o$, are removed from the oxygen exchange layer 110 into the switching layer to augment the vacancies created during the anneal process described above. Movement of vacancies in response to an electric field generated in the RRAM device 300 leads to a formation of a "conductive $V_o$ filament" in and extending across the switching layer 108 (point B).

FIG. 3B depicts an illustration of a filament 302 in the RRAM device 300, in an accordance with an embodiment of the present disclosure. It is to be appreciated that a size of the filament 302 may be determined by the electroforming voltage and the resistance of the RRAM device before the process of electro-forming. With a conductive filament, bridging the top electrode 112 and the first conductive electrode 104, the RRAM device 300 is said to be almost immediately conductive. Referring again to the I-V plot, RRAM device 300 becomes conductive and the current through the RRAM device starts to increase (point B to C), until it reaches a predetermined upper limit known as a compliance current, $I_{Comp}$. The current through the RRAM device 300 does not continue to increase beyond $I_{Comp}$. In an embodiment, when the RRAM device is coupled with a transistor, $I_{Comp}$ may be the maximum current that the transistor can deliver to the RRAM device 300. At point C, the RRAM device 300 is in a low resistance state.

By reducing the magnitude of the voltage (while maintaining a positive polarity) between the top electrode 112 and first conductive electrode 104 (moving from point C to D and then to point A), causes a reduction in a strength of the electric field. By applying a voltage of an opposite polarity between the top electrode 112 and first conductive electrode 104 (moving from point A to F), causes a reversal in a direction of the electric field. In response to the change in the direction of the electric field, the oxygen vacancies (technically positively charged ions) move towards the oxygen exchange layer 110, leading to a dissolution of the conductive filament in the switching layer 108 and in the switching layer 108. Filament dissolution takes place at a critical voltage (point F), termed $V_{Reset}$. In an embodiment, $V_{Reset}$ is between −0.8 V and −1.0 V. Increasing the magnitude of the voltage beyond $V_{Reset}$ changes the current flowing through the device. With a dissolved filament, the current through the RRAM device 300 decreases dramatically and the device returns to a high resistance state (point G). FIG. 3C depicts an illustration of a dissolved filament 304 in the RRAM device 300, in an accordance with an embodiment of the present disclosure.

Referring again to the I-V plot in FIG. 3A, it is to be appreciated that the high resistance level of the RRAM device, point G, is different and lower in magnitude compared to the resistance level of the device before the onset of the forming process. In other words, the resistance level of the RRAM device 300 in a high resistance state can be over 10 times smaller than the virgin resistance (discussed above). By decreasing the magnitude of the voltage, traversing from point G to H and then to point I in the I-V plot, the dissolved filament is recreated again under the action of vacancy migration (at point I). At a critical voltage, $V_{set}$, the filament completely bridges the top electrode 112 and the first conductive electrode 104 and current begins to flow through the RRAM device. In In an embodiment, $V_{Set}$ is less than 1.0 V. The RRAM device is once again said to be in a conductive or a low resistance state (at point J). The filament that is recreated at point J may have a size that is comparable to the size of the filament formed during the electro-forming process.

The cycling of an RRAM device 300 in this manner, where the resistance levels remain unchanged when the voltage between the top electrode 112 and the first conductive electrode 104 is set to 0V, leads to realization of non-volatile memory. By increasing the magnitude of the voltage to at least 0.0.05V, the resistance state of the RRAM device 300 can be read. In one example, a voltage of 0.05V to 0.2V, referred to as a read voltage, $V_R$, is much less than the switching voltage ($V_{set}$ or $V_{Reset}$) and does not perturb the resistance state of the RRAM device 300. It is to be appreciated that the values $V_{set}$ and $V_{Reset}$ generally refer to a portion of a voltage that may be applied to a transistor in series with the RRAM device 300. The RRAM device 300 coupled with a transistor in this manner is given the term embedded memory.

Figure 4:
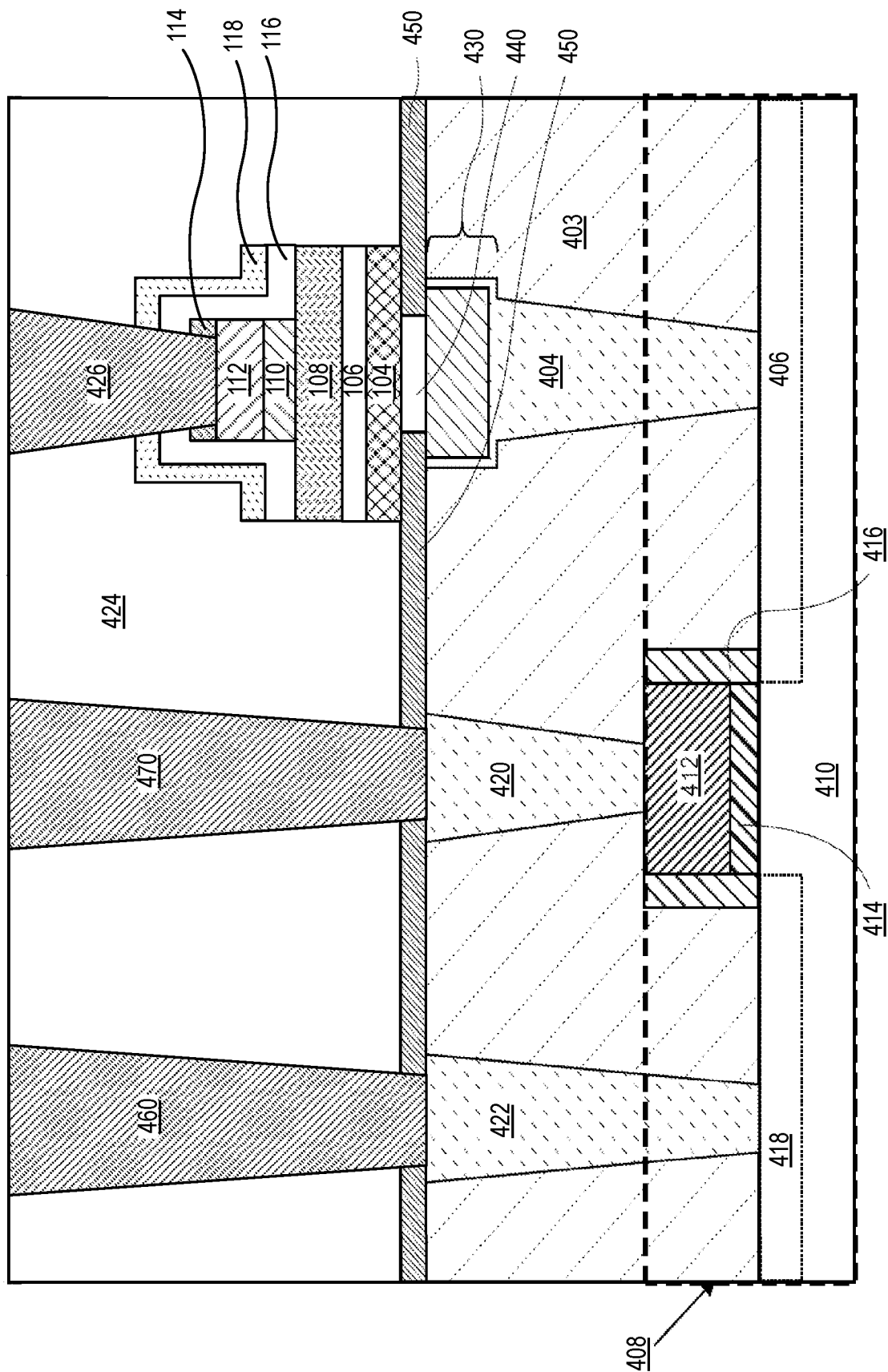
FIG. 4 illustrates a cross-sectional view of an RRAM element coupled to a drain side of a select transistor, in accordance with an embodiment of the present invention.

FIG. 4 illustrates a cross-sectional view of an RRAM device such as the RRAM device 252 formed above a metallization structure 430 coupled to an access transistor 408, in accordance with an embodiment of the present disclosure.

The RRAM device 100 includes the electrode structure 102 having the first width, the switching layer 108, having the first width, disposed on the electrode structure 102. The RRAM device 100 further includes the oxygen exchange layer 110, having the second width, disposed on the switching layer 108, where the second width is less than the first width, the top electrode 112 disposed on the oxygen exchange layer 110 and the hardmask 114 disposed on the top electrode 112. In the illustrative embodiment, the encapsulation layer 116 is disposed on a portion of the switching layer 108 and extends along a sidewall, of the oxygen exchange layer to an uppermost portion of the hardmask 114 and covers an uppermost surface of the hardmask 114.

The RRAM device 100 is disposed on an intermediate via 440 and on a portion of a passivation layer 450. In an embodiment, the intermediate via 440 includes a material that is the same as or substantially the same as the material of the via 122 described in association with FIG. 1. In an embodiment, the passivation layer 450 includes a material that is the same as or substantially the same as the material of the passivation layer 126 described in association with FIG. 1.

In an embodiment, the passivation layer 450 and the intermediate via 440 are disposed on a conductive interconnect 430 that is coupled to a contact structure 404. In an embodiment, contact structure 404 is above and electrically coupled with a drain region 406 of an access transistor 408 disposed above a substrate 410. In an embodiment, the conductive interconnect 430 includes one or more embodiments of the conductive interconnect 202 described in association with FIG. 2. In an embodiment, the conductive interconnect 430 is disposed is a via formed in a dielectric layer 403.

In an embodiment, the underlying substrate 410 represents a surface used to manufacture integrated circuits. Suitable substrate 410 includes a material such as single crystal silicon, polycrystalline silicon and silicon on insulator (SOI), as well as similar substrates formed of other semiconductor materials. The substrate 410 may also include semiconductor materials, metals, dielectrics, dopants, and other materials commonly found in semiconductor substrates.

In an embodiment, the access transistor 408 associated with substrate 410 are metal-oxide-semiconductor field-effect transistors (MOSFET or simply MOS transistors), fabricated on the substrate 410. In various implementations of the disclosure, the access transistor 408 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 408 of substrate 410 includes a gate stack formed of at least two layers, a gate dielectric layer 414 and a gate electrode layer 412. The gate dielectric layer 414 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 414 to improve its quality when a high-k material is used.

The gate electrode layer 412 of the access transistor 408 of substrate 410 is formed on the gate dielectric layer 414 and may consist of at least one P-type work function metal or N-type work function metal, depending on whether the transistor is to be a PMOS or an NMOS transistor. In some implementations, the gate electrode layer 412 may consist of a stack of two or more metal layers, where one or more metal layers are work function metal layers and at least one metal layer is a conductive fill layer.

For a PMOS transistor, metals that may be used for the gate electrode layer 412 include, but are not limited to, ruthenium, palladium, platinum, cobalt, nickel, and conductive metal oxides, e.g., ruthenium oxide. A P-type metal layer will enable the formation of a PMOS gate electrode layer 412 with a work-function that is between about 4.9 eV and about 4.2 eV. For an NMOS transistor, metals that may be used for the gate electrode layer 412 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 412 with a work-function that is between about 3.9 eV and about 4.2 eV.

In some implementations, the gate electrode layer 412 may consist of a "U"-shaped structure that includes a bottom portion substantially parallel to the surface of the substrate 410 and two sidewall portions that are substantially perpendicular to the top surface of the substrate 410. In another implementation, at least one of the metal layers that form the gate electrode layer 412 may simply be a planar layer that is substantially parallel to the top surface of the substrate 410 and does not include sidewall portions substantially perpendicular to the top surface of the substrate 410. In further implementations of the disclosure, the gate electrode layer 412 may consist of a combination of U-shaped structures and planar, non-U-shaped structures. For example, the gate electrode layer 412 may consist of one or more U-shaped metal layers formed atop one or more planar, non-U-shaped layers.

In some implementations of the disclosure, a pair of sidewall spacers 416 may be formed on opposing sides of the gate stack that bracket the gate stack. The sidewall spacers 416 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source region 418 and drain region 406 are formed within the substrate 410 adjacent to the gate stack of each MOS transistor. The source region 418 and drain region 406 are generally formed using either an implantation/diffusion process or an etching/deposition process. In the former process, dopants such as boron, aluminum, antimony, phosphorous, or arsenic may be ion-implanted into the substrate 410 to form the source region 418 and drain region 406. An annealing process that activates the dopants and causes them to diffuse further into the substrate 410 typically follows the ion implantation process. In the latter process, the substrate 410 may first be etched to form recesses at the locations of the source and drain regions. An epitaxial deposition process may then be carried out to fill the recesses with material that is used to fabricate the source region 418 and drain region 406. In some implementations, the source region 418 and drain region 406 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 418 and drain region 406 may be formed using one or more alternate semiconductor materials such as germanium or a suitable group III-V compound. And in further embodiments, one or more layers of metal and/or metal alloys may be used to form the source region 418 and drain region 406.

In an embodiment, an RRAM contact 426 is disposed in a second dielectric layer 424 disposed above the passivation layer 450. In an embodiment, second dielectric layer includes a material that is similar to or substantially similar to the material of the dielectric layer 403. In an embodiment, a gate contact 420 and a source contact 422 are disposed in the dielectric layer 403 above the gate electrode layer 412 and source region 418, respectively. In an embodiment, a source conductive interconnect 460 is disposed in a via formed in the second dielectric layer 424 and in the passivation layer 450. The source conductive interconnect 460 is in contact with and coupled with the source contact 422. In an embodiment, a gate conductive interconnect 470 is disposed in a via formed in the second dielectric layer 424 and in the passivation layer 450. The gate conductive interconnect 470 is in contact with and coupled with the gate contact 420.

Figure 5:
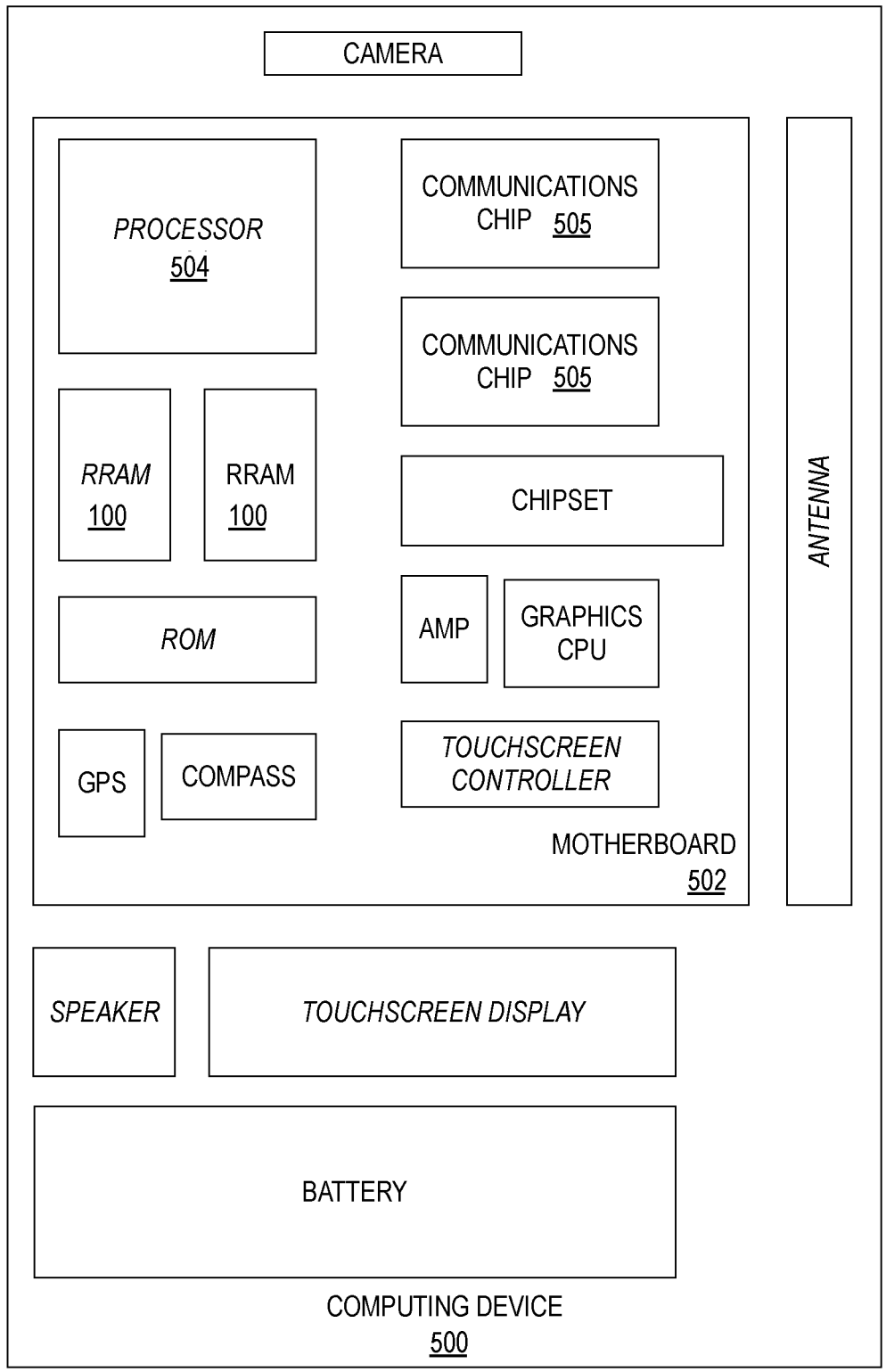
FIG. 5 illustrates a computing device in accordance with embodiments of the present invention.

FIG. 5 illustrates a computing device 500 in accordance with one embodiment of the disclosure. FIG. 5 illustrates a computing device 500 in accordance with one embodiment of the disclosure. The computing device 500 houses a motherboard 502. The motherboard 502 may include a number of components, including but not limited to a processor 504 and at least one communication chip 506. The processor 504 is physically and electrically coupled to the motherboard 502. In some implementations, the at least one communication chip 506 is also physically and electrically coupled to the motherboard 502. In further implementations, the communication chip 506 is part of the processor 504.

Depending on its applications, computing device 500 may include other components that may or may not be physically and electrically coupled to the motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of embodiments of the disclosure, the integrated circuit die of the processor includes one or more memory devices, such as an RRAM device 100 including a dual bottom electrode 326 in accordance with embodiments of the present disclosure. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of an embodiment of the disclosure, the integrated circuit die of the communication chip includes RRAM elements such as RRAM device 100 integrated with access transistors, built in accordance with embodiments of the present disclosure.

In further implementations, another component housed within the computing device 500 may contain a stand-alone integrated circuit memory die that includes one or more memory elements such as RRAM device 100, built in accordance with embodiments of the present disclosure.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
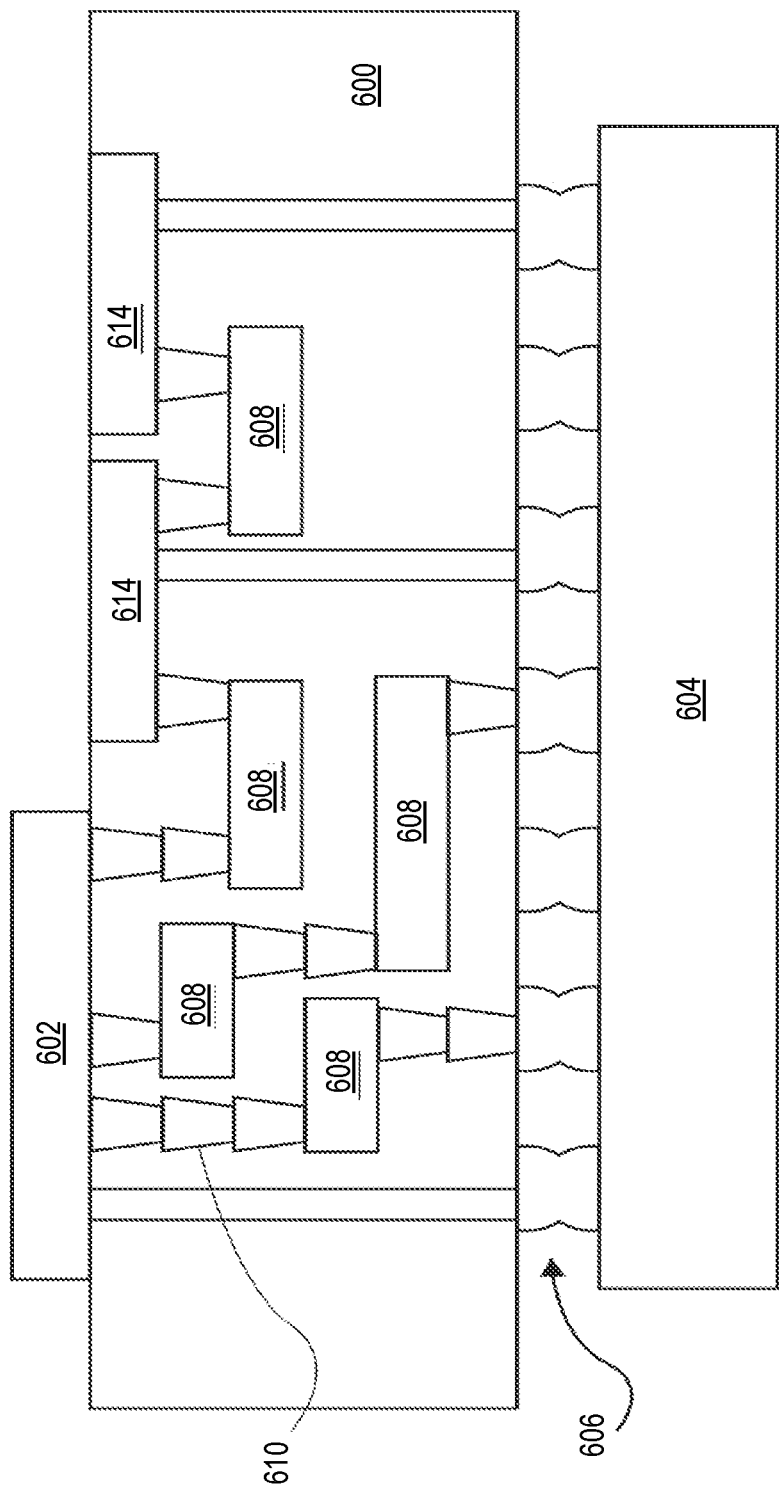
FIG. 6 illustrates an interconnect structure that includes one or more embodiments of the invention.

FIG. 6 illustrates an integrated circuit (IC) structure 600 that includes one or more embodiments of the disclosure. The integrated circuit (IC) structure 600 is an intervening structure used to bridge a first substrate 602 to a second substrate 604. The first substrate 602 may be, for instance, an integrated circuit die. The second substrate 604 may be, for instance, a memory module, a computer mother, or another integrated circuit die. The memory module may include one or more memory devices such as an RRAM device 100. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 606 that can subsequently be coupled to the second substrate 604. In some embodiments, the first and second substrates 602/604 are attached to opposing sides of the integrated circuit (IC) structure 600. In other embodiments, the first and second substrates 602/604 are attached to the same side of the integrated circuit (IC) structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure 600 may be formed of alternate rigid or flexible materials that may include the same materials described above for use in a semiconductor substrate, such as silicon, germanium, and other group III-V and group IV materials.

The integrated circuit (IC) structure 600 may include metal interconnects 608 and via 610, including but not limited to through-silicon vias (TSVs) 610. The integrated circuit (IC) structure 600 may further include embedded devices 614, including both passive and active devices. Such devices include, but are not limited to, capacitors, decoupling capacitors, resistors, inductors, fuses, diodes, transformers, transistors, one or more RRAM devices such as RRAM device 100, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 600. In accordance with embodiments of the present disclosure, apparatuses or processes disclosed herein may be used in the fabrication of integrated circuit (IC) structure 600.

Thus, embodiments of the present disclosure include an RRAM device for memory applications and methods of fabrication.

In first examples, an apparatus, includes an interconnect having a conductive material, and a resistive random access memory (RRAM) device coupled to the interconnect. The RRAM device includes an electrode structure above the interconnect, where an upper portion of the electrode structure has a first width. The RRAM device further includes a switching layer on the electrode structure, where the switching layer has the first width and an oxygen exchange layer, having a second width less than the first width, on a portion of the switching layer. The RRAM device further includes a top electrode above the oxygen exchange layer, where the top electrode has the second width and an encapsulation layer on a portion of the switching layer, where the switching layer extends along a sidewall of the oxygen exchange layer.

In second examples, for any of first examples, the encapsulation layer further includes a lateral portion, where the lateral portion has a length greater than a thickness of the encapsulation layer along the sidewall of the oxygen exchange layer.

In third examples, for any of the first through second examples, the encapsulation layer has a thickness on the sidewall of the oxygen exchange layer between 3 nm-5 nm.

In fourth examples, for any of the first through third examples, the encapsulation layer is a first encapsulation layer and the apparatus further includes a second encapsulation layer on the first encapsulation layer, wherein the second encapsulation is absent from a sidewall of the switching layer.

In fifth examples, for any of the first through fourth examples, the first width is at least 20 nm larger than the second width.

In sixth examples, for any of the first through fifth examples, the electrode structure includes one or more of WN, TiN, TaN, W, Ti, Ta, or Ru.

In seventh examples, for any of the first through sixth examples, the electrode structure includes a first conductive layer above the interconnect and a second conductive layer on the first conductive layer.

In eighth examples, for any of the first through seventh examples, first conductive layer includes one or more of WN, TiN, TaN, W, Ti, Ta, or Ru.

In ninth examples, for any of the first through eighth examples, the second conductive layer includes a noble metal.

In tenth examples, for any of the first through ninth examples, the first conductive layer has a thickness between 10 nm and 25 nm and the second conductive layer has a thickness between 20 nm and 50 nm.

In eleventh examples, for any of the first through tenth examples, the switching layer includes a metal and oxygen.

In twelfth examples, for any of the first through eleventh examples, the switching layer includes an oxide selected from the group consisting of hafnium oxide, tantalum oxide, zirconium oxide, titanium oxide, aluminum oxide and tungsten oxide.

In thirteenth examples, for any of the first through twelfth examples, the switching layer has a thickness between 1 nm-5 nm and the oxygen exchange layer has a thickness of at least 3 nm.

In fourteenth examples, for any of the first through thirteenth examples the top electrode includes one or more of titanium nitride, tantalum nitride, tungsten and ruthenium.

In fifteenth examples, includes a 1T-1R memory cell, the 1T-1R memory cell includes a transistor above a substrate, where the transistor includes a source structure and a drain structure, a gate structure between the source structure and the drain structure, a source contact coupled to the source structure and a drain contact coupled to the drain structure, an interconnect disposed above the drain contact and coupled to the drain contact and a resistive random access memory (RRAM) device coupled to the interconnect. The RRAM device includes an electrode structure above the interconnect, where an upper portion of the electrode structure has a first width. The RRAM device further includes a switching layer on the electrode structure, where the switching layer has the first width and an oxygen exchange layer, having a second width less than the first width, on a portion of the switching layer. The RRAM device further includes a top electrode above the oxygen exchange layer, where the top electrode has the second width and an encapsulation layer on a portion of the switching layer, where the switching layer extends along a sidewall of the oxygen exchange layer.

In sixteenth examples, for any of the fifteenth examples, the encapsulation layer further includes a lateral portion, having a length greater than a thickness of the encapsulation layer along the sidewall of the oxygen exchange layer.

In seventeenth examples, for any of the fifteenth through sixteenth examples, the encapsulation layer has a thickness on the sidewall of the oxygen exchange layer between 3 nm-5 nm.

In eighteenth examples, for any of the fifteenth through seventeenth examples, the encapsulation layer is a first encapsulation layer and the apparatus further includes a second encapsulation layer on the first encapsulation layer, wherein the second encapsulation is absent from a sidewall of the switching layer.

In nineteenth examples, for any of the fifteenth through eighteenth examples, the first width is at least 20 nm larger than the second width.

In twentieth examples, for any of the fifteenth through nineteenth examples, the electrode structure includes a first conductive layer above the interconnect and wherein the first conductive layer includes one or more of WN, TiN, TaN, W, Ti, Ta, or Ru. The electrode structure further includes a second conductive layer on the first conductive layer, wherein second conductive layer includes a noble metal.

In twenty first examples, a method of fabricating a memory device includes forming a conductive interconnect in a dielectric layer above a substrate. The method further includes depositing a bottom electrode layer above the conductive interconnect and depositing a switching layer on the bottom electrode layer. The method further includes depositing an oxygen exchange layer on the switching material layer and depositing a top electrode layer above the oxygen exchange layer. The method further includes forming a sidewall in the top electrode and in the oxygen exchange layer by patterning the top electrode layer and the oxygen exchange layer and forming an encapsulation layer above and on a sidewall of the top electrode, on sidewalls of the oxygen exchange layer and on the switching material layer. The method further includes patterning the encapsulation layer and leaving a portion of the encapsulation layer on the sidewall of the oxygen exchange layer. The method further includes forming a switching layer and a bottom electrode by masking an etch of the switching material layer and the bottom electrode layer with the portion of the encapsulation layer on the sidewall of the oxygen exchange layer.

In twenty second examples, for any of the twenty first examples, the encapsulation layer is a first encapsulation layer and where forming the memory device further includes depositing a second encapsulation layer on the first encapsulation layer before patterning the first encapsulation layer. The method further includes patterning the second encapsulation layer, and then patterning the first encapsulation layer.

In twenty third examples, for any of the twenty first through twenty second examples, the second encapsulation layer masking the first encapsulation layer during the patterning of the switching material layer and the bottom electrode layer.

In twenty fourth examples, for any of the twenty first through twenty third examples, the method includes removing an uppermost portion of the second encapsulation layer above the top electrode during the patterning of the switching material layer and the bottom electrode layer.

In twenty fifth examples, for any of the twenty first through twenty fourth examples the method of fabricating the memory device further includes forming a dielectric hardmask layer on the top electrode, patterning the dielectric hardmask layer into a dielectric hardmask and masking an etch of the top electrode layer with the dielectric hardmask.

What is claimed is:

1. An apparatus, comprising:
    an interconnect comprising a conductive material; and
    a resistive random access memory (RRAM) device coupled to the interconnect, the RRAM device comprising:
        an electrode structure above the interconnect, an upper portion of the electrode structure having a first width;
        a switchable layer on the electrode structure, the switchable layer having the first width;
        an oxygen exchange layer on a portion of the switchable layer, the oxygen exchange layer having a second width less than the first width;
        a top electrode above the oxygen exchange layer, the top electrode having the second width;
        a first encapsulation layer on a portion of the switchable layer and extending along a sidewall of the oxygen exchange layer, the first encapsulation layer having outermost sidewalls separated by a distance equal to or less than the first width; and
        a second encapsulation layer on the first encapsulation layer, the second encapsulation layer having outermost sidewalls separated by a distance equal to or less than the first width;
        wherein the outermost sidewalls of the first encapsulation layer and the outermost sidewalls of the second encapsulation layer are respectively aligned with one another.

2. The apparatus of claim 1, wherein the first encapsulation layer further comprises a lateral portion, the lateral portion having a length greater than a thickness of the first encapsulation layer along the sidewall of the oxygen exchange layer.

3. The apparatus of claim 2, wherein the first encapsulation layer thickness is between 3 nm and 5 nm.

4. The apparatus of claim 1, wherein the first width is at least 20 nm larger than the second width.

5. The apparatus of claim 1, wherein the electrode structure comprises one or more of tungsten nitride, titanium nitride, tungsten, titanium, tantalum, and ruthenium, and the top electrode comprises one or more of titanium nitride, tantalum nitride, tungsten and ruthenium.

6. The apparatus of claim 1, wherein the electrode structure comprises:
   a first conductive layer above the interconnect; and
   a second conductive layer on the first conductive layer;
   wherein an outermost sidewall of the first conductive layer and an outermost sidewall of the second conductive layer are aligned with one another.

7. The apparatus of claim 6, wherein the first conductive layer comprises one or more of tungsten nitride, titanium nitride, tungsten, titanium, tantalum, and ruthenium, and the second conductive layer comprises a noble metal, and wherein the first conductive layer has a thickness between 10 nm and 25 nm, and the second conductive layer has a thickness between 20 nm and 50 nm.

8. The apparatus of claim 6, wherein an outermost sidewall of the switchable layer is aligned with the outermost sidewall of the second conductive layer.

9. The apparatus of claim 6, wherein the outermost sidewalls of the first encapsulation layer is tapered in profile, the outermost sidewalls of the second encapsulation layer is tapered in profile, an outermost sidewall of the switchable layer is tapered in profile, the outermost sidewall of the first conductive layer is tapered in profile, and/or the outermost sidewall of the second conductive layer is tapered in profile.

10. The apparatus of claim 1, wherein the switchable layer comprises a metal and oxygen.

11. The apparatus of claim 1, wherein the switchable layer includes an oxide selected from the group consisting of hafnium oxide, tantalum oxide, zirconium oxide, titanium oxide, aluminum oxide and tungsten oxide.

12. The apparatus of claim 1, wherein the switchable layer has a thickness between 1 nm to 5 nm and the oxygen exchange layer has a thickness of at least 3 nm.

13. The apparatus of claim 1, wherein the RRAM device is within a layer of dielectric material.

14. A IT-IR memory cell, comprising:
   a transistor above a substrate, the transistor comprising:
      a source structure and a drain structure;
      a gate structure between the source structure and the drain structure; and
      a source contact coupled to the source structure and a drain contact coupled to the drain structure;
   an interconnect disposed above the drain contact and coupled to the drain contact; and
   a resistive random access memory (RRAM) device coupled to the interconnect, the RRAM device comprising:
      an electrode structure above the interconnect, an upper portion of the electrode structure having a first width;
      a switchable layer on the electrode structure, the switchable layer having the first width;
      an oxygen exchange layer on a portion of the switchable layer, the oxygen exchange layer having a second width less than the first width;
      a top electrode above the oxygen exchange layer, the top electrode having the second width;
      a first encapsulation layer on a portion of the switchable layer and extending along a sidewall of the oxygen exchange layer; and
      a second encapsulation layer on the first encapsulation layer;
   wherein sidewalls of the first encapsulation layer, the second encapsulation layer, and the electrode structure are aligned with one another so as to collectively provide at least part of an overall sidewall.

15. The IT-IR memory cell of claim 14, wherein the first encapsulation layer further comprises a lateral portion, having a length greater than a thickness of the first encapsulation layer along the sidewall of the oxygen exchange layer.

16. The IT-IR memory cell of claim 14, wherein the first encapsulation layer has a thickness on the sidewall of the oxygen exchange layer between 3 nm and 5 nm.

17. The IT-IR memory cell of claim 14, wherein the first width is at least 20 nm larger than the second width.

18. The IT-IR memory cell of claim 14, wherein the electrode structure comprises:
   a first conductive layer above the interconnect, wherein the first conductive layer comprises one or more of tungsten nitride, titanium nitride, tungsten, titanium, tantalum, and ruthenium; and
   a second conductive layer on the first conductive layer, wherein second conductive layer comprises a noble metal;
wherein each of the first and second conductive layers has the first width.

19. A method of fabricating a memory device, the method comprising:
   forming a conductive interconnect in a dielectric layer above a substrate;
   depositing a bottom electrode layer above the conductive interconnect;
   depositing a switching layer on the bottom electrode layer;
   depositing an oxygen exchange layer on the switching material layer;
   depositing a top electrode layer above the oxygen exchange layer;
   forming a sidewall in the top electrode and in the oxygen exchange layer by patterning the top electrode layer and the oxygen exchange layer;
   forming a first encapsulation layer above and on a sidewall of the top electrode, on sidewalls of the oxygen exchange layer and on the switching material layer;
   depositing a second encapsulation layer on the first encapsulation layer;
   patterning the second encapsulation layer;
   patterning the first encapsulation layer and leaving a portion of the first encapsulation layer on the sidewall of the oxygen exchange layer; and
   forming a switching layer and a bottom electrode by masking an etch of the switching material layer and the bottom electrode layer with the portion of the first encapsulation layer on the sidewall of the oxygen exchange layer.

20. The method of claim 19, the second encapsulation layer masking the first encapsulation layer during the patterning of the switching material layer and the bottom electrode layer.

21. The method of claim 20, wherein an uppermost portion of the second encapsulation layer above the top electrode is removed during the patterning of the switching material layer and the bottom electrode layer.

22. The method of claim 19, wherein, fabricating the memory device further comprises:
- forming a dielectric hardmask layer on the top electrode;
- patterning the dielectric hardmask layer into a dielectric hardmask; and
- masking an etch of the top electrode layer with the dielectric hardmask.

23. The apparatus of claim 1, wherein a thickness of the oxygen exchange layer is at least one and a half times the thickness of the switchable layer.

24. The 1T-1R memory cell of claim 14, wherein a thickness of the oxygen exchange layer is at least one and a half times the thickness of the switchable layer.

25. The method of claim 19, wherein the second encapsulation layer is absent from a sidewall of the switching layer.

* * * * *